United States Patent [19]
Kitanaka et al.

[11] Patent Number: 5,664,688
[45] Date of Patent: Sep. 9, 1997

[54] VERTICAL INSTALLATION SYSTEM IN WHICH INFORMATION PROCESSING APPARATUSES ARE INSTALLED

[75] Inventors: Takeshi Kitanaka; Atsushi Masuda; Yoshio Utsugi, all of Kawasaki, Japan

[73] Assignee: Fujitsu Limited, Kawasaki, Japan

[21] Appl. No.: 729,514

[22] Filed: Oct. 11, 1996

Related U.S. Application Data

[63] Continuation of Ser. No. 582,596, Jan. 3, 1996, abandoned, which is a continuation of Ser. No. 214,284, Mar. 17, 1994, abandoned.

[30] Foreign Application Priority Data

Mar. 30, 1993 [JP] Japan ................... 5-072196

[51] Int. Cl.$^6$ ............................ A47G 7/00
[52] U.S. Cl. ................... 211/26; 414/267; 169/54; 211/189
[58] Field of Search ................ 211/26, 191, 127, 211/189; 414/266, 267; 169/54, 16

[56] References Cited

U.S. PATENT DOCUMENTS

| | | |
|---|---|---|
| 2,918,176 | 12/1959 | Bell et al. ............ 211/191 |
| 3,802,574 | 4/1974 | Weider ............ 169/54 |
| 5,011,031 | 4/1991 | Konstant ............ 211/191 |
| 5,107,993 | 4/1992 | Zingrini et al. ............ 211/26 X |
| 5,172,306 | 12/1992 | Cantrell ............ 211/41 X |

*Primary Examiner*—Blair Johnson
*Attorney, Agent, or Firm*—Staas & Halsey

[57] ABSTRACT

A vertical installation structure includes a plurality of placing stages on each of which information processing apparatuses are to be installed, and supporting members for supporting the plurality of placing stages so that the plurality of placing stages are vertically arranged. A vertical installation system includes the above vertical installation structure, and moving structure capable of moving along the vertical installation structure, the moving structure having a plurality of stages on each of which at least one information processing apparatus is to be placed and supporting members for supporting the plurality of stages so that each of the plurality of stages is level with a corresponding one of the plurality of placing stages of the vertical installation structure. The information processing apparatus set on each of the stages is transferred to the corresponding one of the plurality of placing stages of the vertical installation structure.

8 Claims, 14 Drawing Sheets

VERTICAL INSTALLATION SYSTEM IN WHICH INFORMATION PROCESSING APPARATUSES ARE INSTALLED

This application is a continuation of application Ser. No. 08/582,596, filed Jan. 3, 1996, now abandoned, which is a continuation of 08/214,284, filed Mar. 17, 1994, now abandoned.

BACKGROUND OF THE INVENTION (1) Field of the invention

The present invention generally relates to an installation system in which information processing apparatuses are installed, and more particularly to an installation system in which information processing apparatuses, such as computers, are vertically installed.

(2) Description of Related Art

Information processing systems have been increasing in size, so that the number of information apparatuses, such as computers, to be installed in computer rooms has increased. Thus, it is expected that a large number of information apparatuses are efficiently installed on a limited floor area of the computer room.

Figure 1:
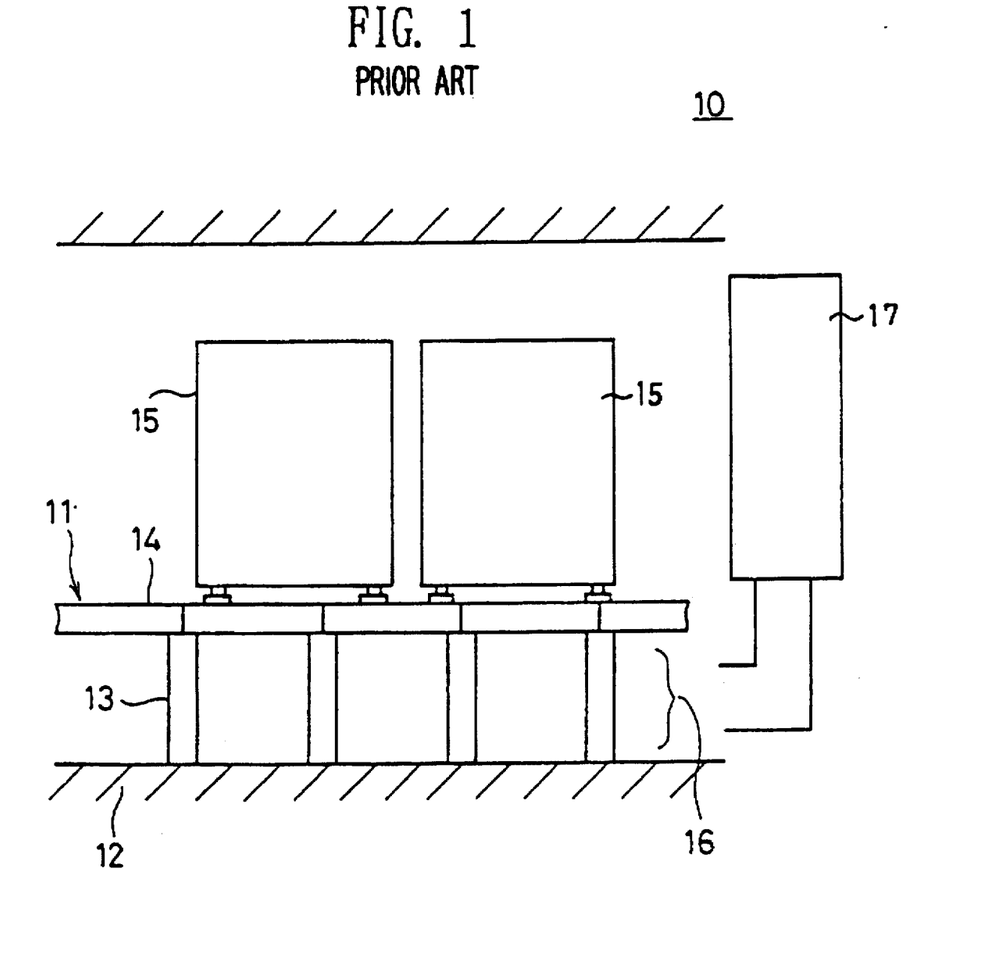
FIG. 1 is a diagram illustrating a conventional installation for information processing apparatuses.

A conventional installation for information processing apparatuses is structured as shown in FIG. 1.

Referring to FIG. 1, an installation 10 is formed of a double-floor set 11. The double-floor set 1 is formed of posts 13 standing on a ground floor 12 and floor panels 14 supported by the posts 13 in a state where the floor panels 14 are connected to each other. A floor formed of the floor panels 14 is an installation floor. Large-scale information processing apparatuses 15 are installed on the installation floor of the double-floor set 11. A space 16 under the installation floor is used for wiring of cables and used as a duct of air-conditioning equipment 17.

In above installation 10 for the information processing apparatuses 15, information apparatuses 15 can be arranged in only a horizontal direction. Thus, the horizontal area needed to install the information processing apparatuses 15 increases in proportion to the number of information processing apparatuses 15. That is, it is difficult to efficiently install a large number of information processing apparatuses 15 on a limited horizontal area in a computer room.

SUMMARY OF THE INVENTION

Accordingly, a general object of the present invention is to provide a novel and useful installation for information processing apparatuses in which the disadvantages of the aforementioned prior art are eliminated.

A specific object of the present invention is to provide an installation on which a large number of information processing apparatuses can be efficiently installed.

The above objects are achieved by a vertical installation structure comprising a plurality of placing stages on each of which information processing apparatuses are to be installed, and supporting members for supporting the plurality of placing stages so that the plurality of placing stages are vertically arranged.

The above objects are also achieved by a vertical installation system comprising at least one vertical installation structure having a plurality of placing stages on each of which information processing apparatuses are to be installed, and supporting members for supporting the plurality of placing stages so that the plurality of placing stages are vertically arranged, and a moving structure capable of moving along the vertical installation structure. The moving structure has a plurality of stages on each of which at least one information processing apparatus is to be placed and supporting members for supporting the plurality of stages so that each of the plurality of stages is level with a corresponding one of the plurality of placing stages of the vertical installation structure, wherein the information processing apparatus set on each of the stages is transferred to the corresponding one of the plurality of placing stages of the vertical installation structure.

According to the present invention, since a plurality of information processing apparatuses are vertically installed in the vertical installation structure, a large number of information processing apparatuses can be efficiently installed in a room.

Additional objects, features and advantages of the present invention will become apparent from the following detailed description with read in conjunction with the accompanying drawings.

DESCRIPTION OF THE PREFERRED EMBODIMENTS

A description will now be given of an embodiment of the present invention.

Figure 2:
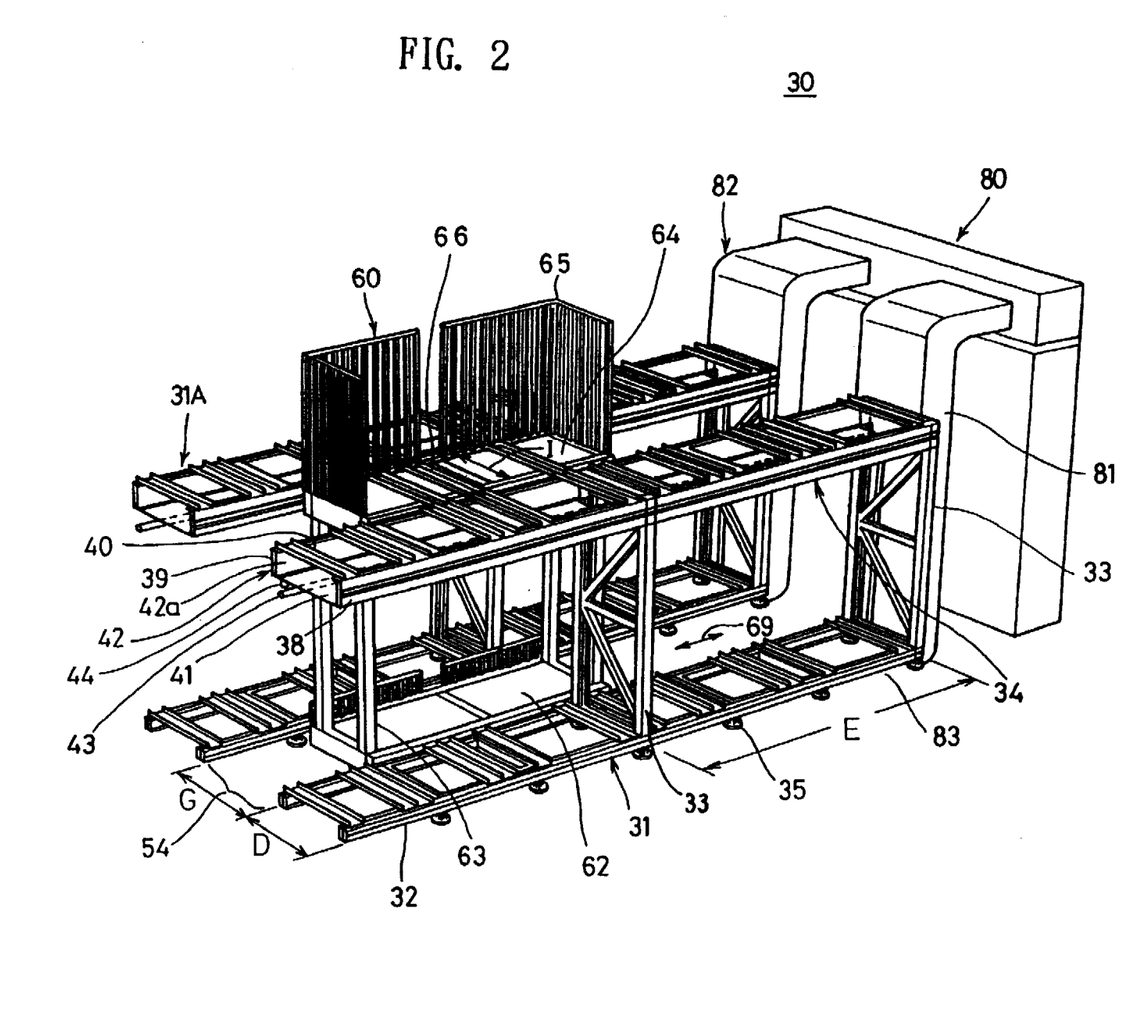
FIG. 2 is a perspective view illustrating an installation according to an embodiment of the present invention.
Figure 3:
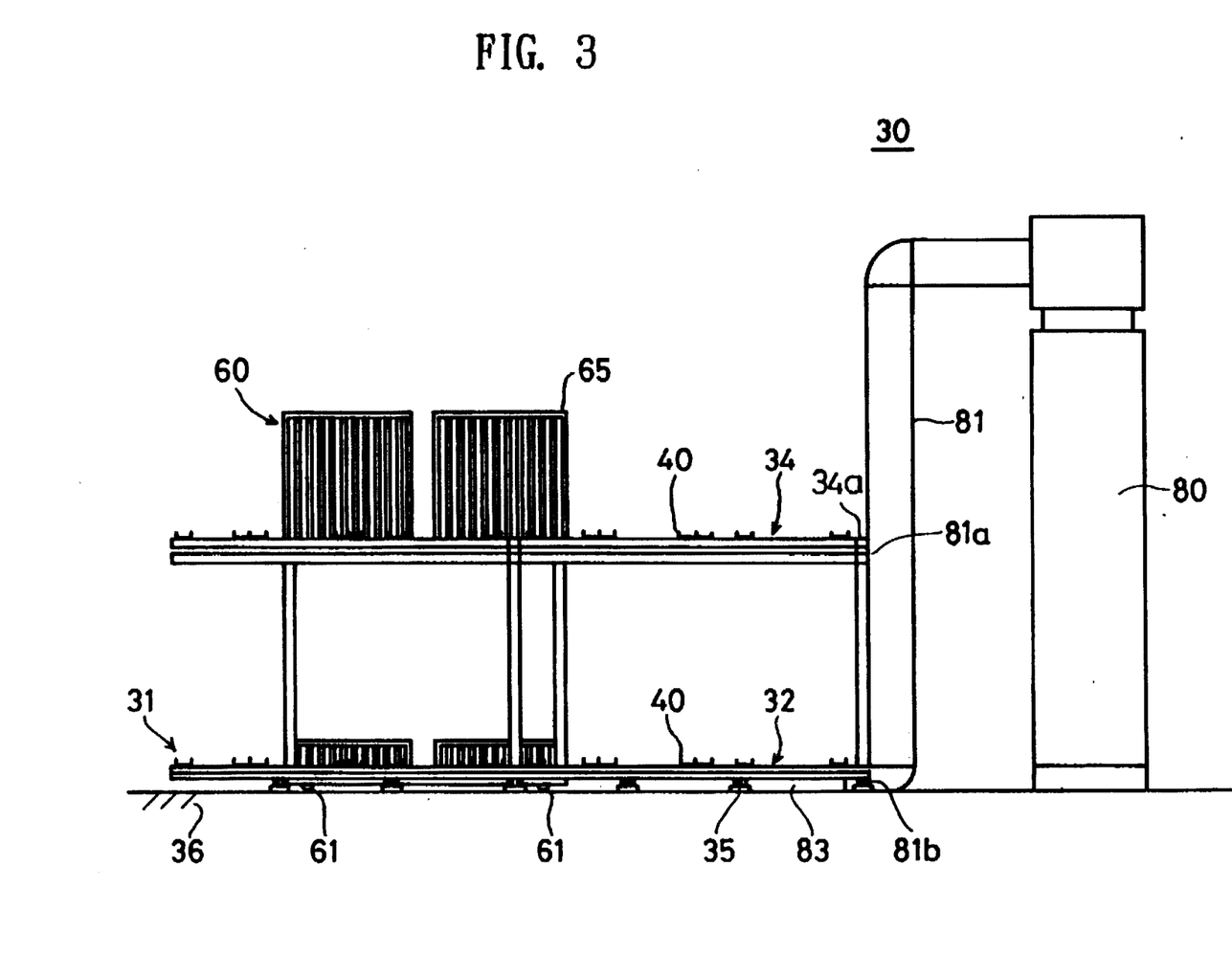
FIG. 3 is a front view of the installation shown in FIG. 2.
Figure 4:
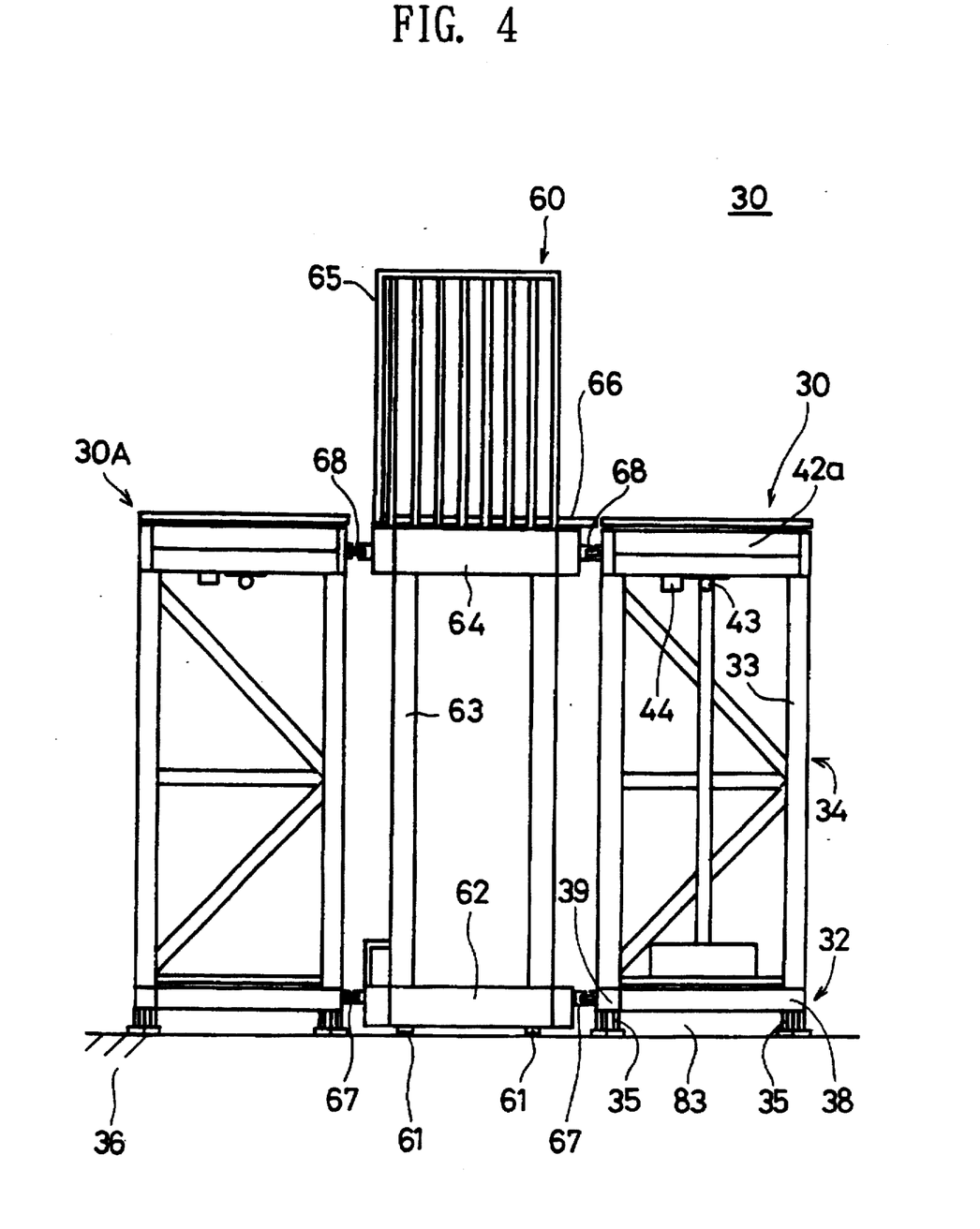
FIG. 4 is a side view of the installation shown in FIG. 2.

FIGS. 2, 3 and 4 show an installation on which information processing apparatuses are to be installed. FIG. 2 is a perspective view of the installation, FIG. 3 is a front view thereof and FIG. 4 is a side view thereof.

Referring to FIGS. 2, 3 and 4, an installation 30 is formed of a vertical installation structure 31 and 31A, a moving structure 60 and an air-conditioning equipment 80. The vertical installation structure 31 is a framed structure and has a lower placing stage 32, supporting bodies 33 standing on the lower placing stage 32 each of which bodies has a truss structure, and an upper placing stage 34 supported by the supporting bodies 33. The lower placing stage 32 is provided with a plurality of vibration-reducing support legs 35. The vertical installation structure 31 is supported by the plurality of vibration-reducing support legs 35 on a floor 36 of a room such as a computer room. Large scale information processing apparatuses (shown in FIG. 9) are able to be installed in the vertical installation structure 31.

The lower placing stage 32 and the upper placing stage 34 are formed as follows.

Each of the lower placing stage 32 and the upper placing stage 34 has a width D and a length E longer than the width D. The width D corresponds to a depth B of each of information processing apparatuses 90 (shown in FIG. 9) to be installed in the vertical installation structure 31. The length E is at least a few times as large as a width A of each of the information processing apparatuses 90.

The upper placing stage 34 is formed of a pair of beams 38 and 39 which are arranged so as to be parallel to each other, many crossbeams 40 which cross the pair of beams 38 and 39, and a cover plate 41 underneath the pair of beams 38 and 39. A U-shaped structure 42 having a U-shaped cross section is formed of the pair of beams 38 and 39 and the cover plate 41. A space 42a inside the U-shaped structure 42 is used as a space for wiring of cables and as a duct for cooled air from the air-conditioning equipment 80. A smoke sampling pipe 43 for a high-sensitivity smoke detector is laid on an outer surface of the U-shaped structure 42 along the length of the cover plate 41. The smoke generated by fire in the installation 30 can be detected by the high-sensitivity smoke detector. $CO_2$-gas sprinklers 44 are also arranged on the outer surface of the U-shaped structure 42 along the length of the cover plate 41. The $CO_2$-gas sprinklers 44 release $CO_2$-gas to extinguish fires.

Figure 5:
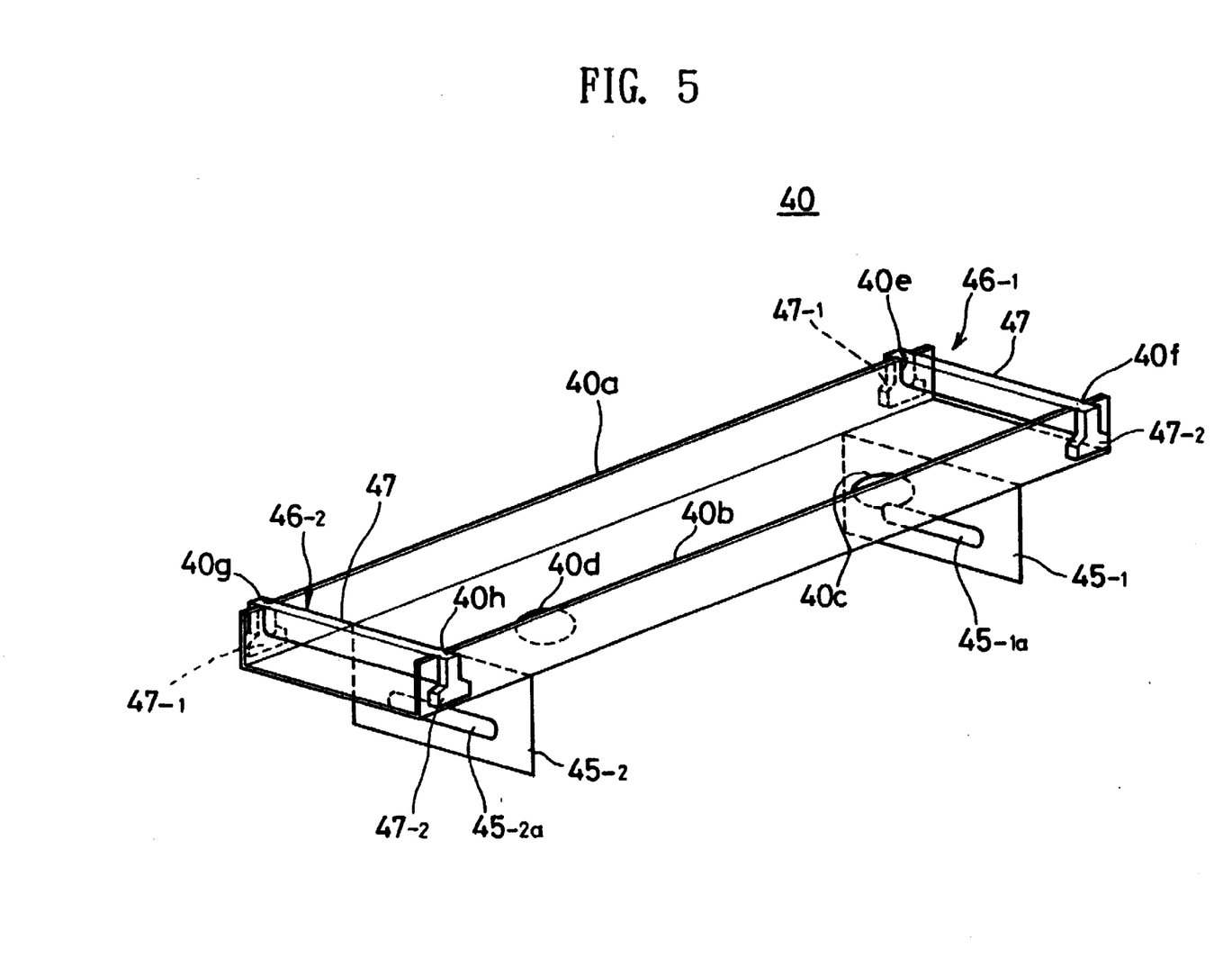
FIG. 5 is a perspective view illustrating a structure of each of crossbeams shown in FIG. 2.

Each of the crossbeams 40 is made of U-steel as shown in FIG. 5. The U-steel has a bottom plate 40-1 and standing walls 40a and 40b projecting from side edges of the bottom plate 40-1 in a direction perpendicular to the bottom plate 40-1. The bottom plate 40-1 is provided with mounting holes 40c and 40d formed at positions near the ends of the U-steel in the longitudinal direction thereof. The mounting holes 40c and 40d are used to mount equipment. The U-steel is provided with brackets 45-1 and 45-2 and stopper mechanisms 46-1 and 46-2 both of which are located near the ends of the U-steel. The brackets 45-1 and 45-2 are used to mount the crossbeam 40 on the beams 38 and 39. Slotted holes 45-1a and 45-2a are respectively formed on the brackets 45-1 and 45-2. The stopper mechanism 46-1 is formed of a stopper bar 47 and engaging ends 47-1 and 47-2. The engaging ends 47-1 and 47-2 of the stopper mechanism 46-1 are respectively engaged with notches 40e and 40f formed on the standing walls 40a and 40b so that the stopper mechanism 46-1 is detachably mounted at one end of the U-steel. The other stopper mechanism 46-2 is also formed of the stopper bar 47 and the engaging ends 47-1 and 47-2 and may be detachably mounted on the other end of the U-steel in the same manner as the stopper mechanism 46-1.

Figure 6A:
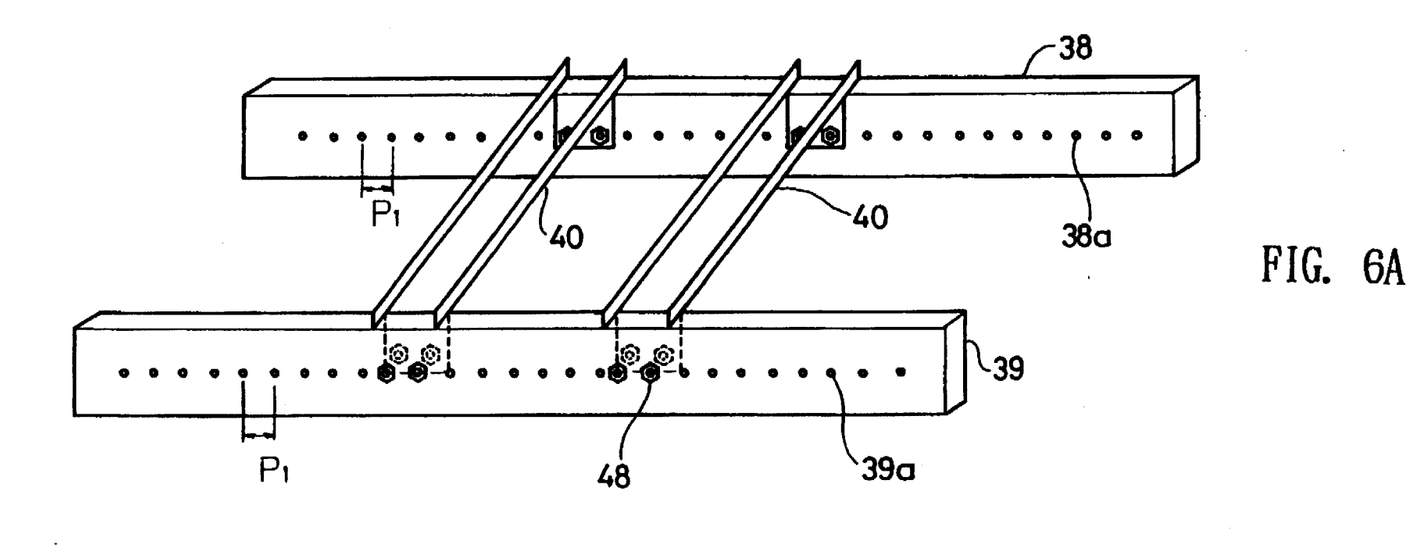
FIG. 6A is a perspective view illustrating a structure in which the crossbeams are mounted on beams.
Figure 6B:
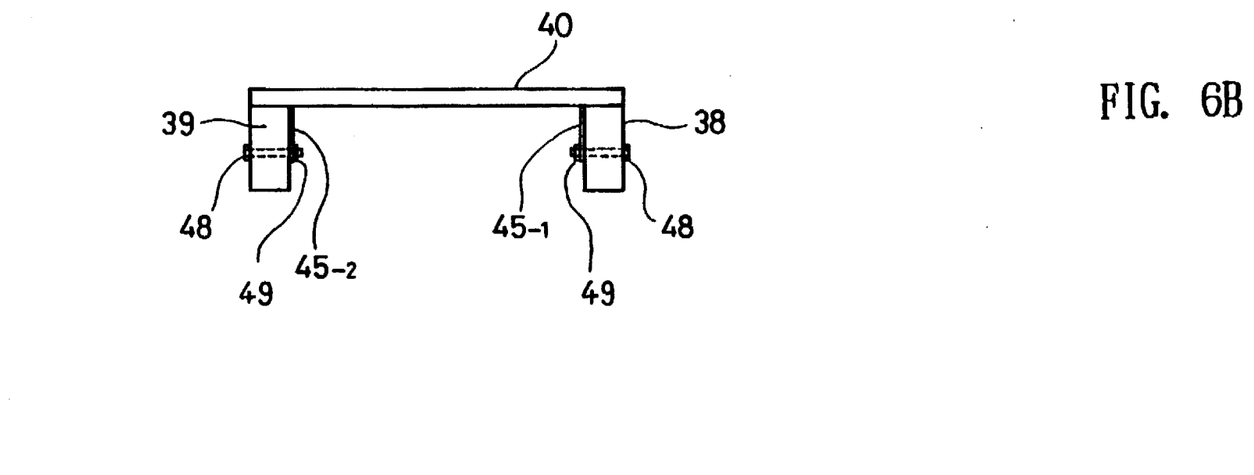
FIG. 6B is a side view of the structure shown in FIG. 6A.

Each of the crossbeams 40 is mounted on the pair of beams 38 and 39 as shown in FIGS. 6A and 6B.

Referring to FIGS. 6A and 6B, the beams 38 and 39 are respectively provided with many holes 38a and 39a which are arranged in the longitudinal direction of the beams 38 and 39 at intervals P1. Each of the crossbeams 40 is placed on the beams 38 and 39, bolts 48 are made to pass through the slotted holes 45-1a and 45-2a of the brackets 45-1 and 45-2 and the holes 38a and 39a of the beams 38 and 39, and nuts 49 and the bolts 48 are tightened so that each of the crossbeams 40 is fixed on the beams 38 and 39. The position at which each of the crossbeams 40 is fixed on the beams 38 and 39 depends on the width B of the information processing apparatus 90 to be installed on the upper placing stage 34. The position of the crossbeams 40 can be changed in the longitudinal direction of the upper placing stage 34 by changing the holes 38a and 39a through which the bolts 48 should pass.

The lower placing stage 32 is formed of a pair of beams and crossbeams mounted on the pair of beams in the same manner as the upper placing stage 34 described above. However, the lower placing stage has neither the cover plate 41, the sampling pipe 43 nor the $CO_2$-gas sprinklers 44. The vibration-reducing support legs 35 are fixed on lower surfaces of the beams 38 and 39 of the lower placing stage 32 so as to be arranged at predetermined intervals.

Figure 7A:
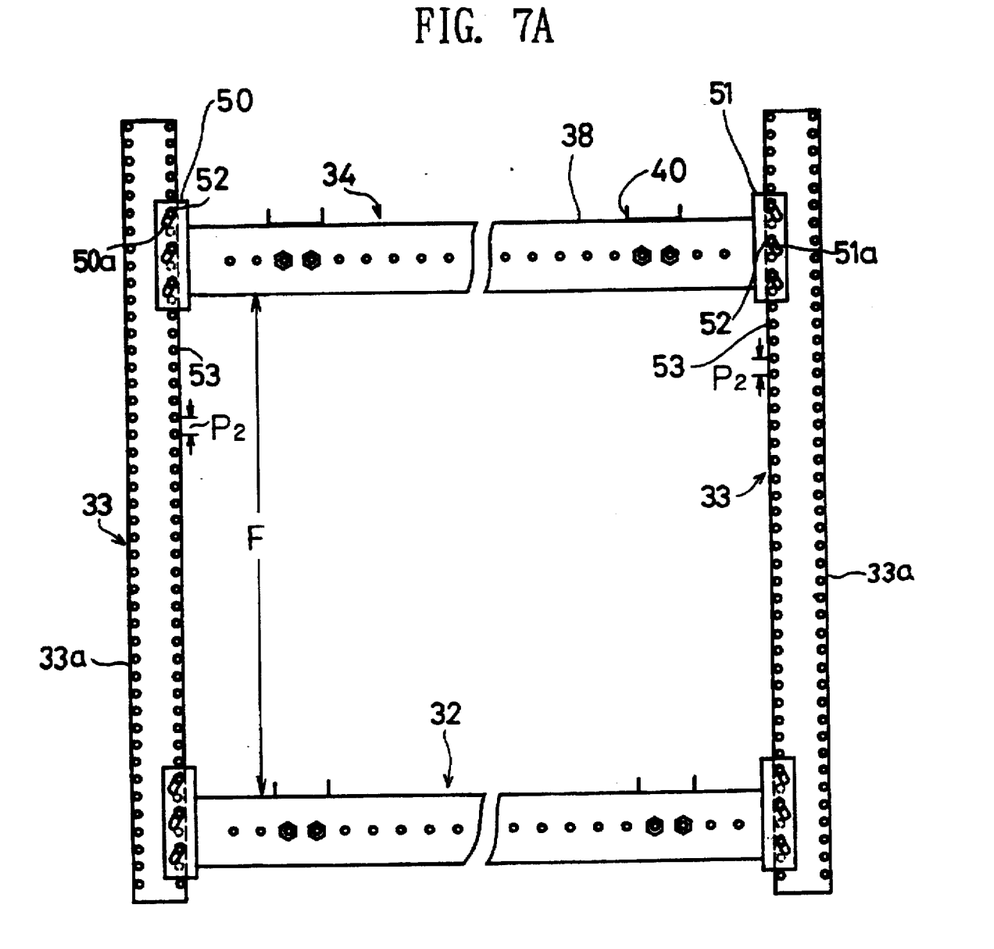
FIGS. 7A and 7B are diagrams illustrating a structure in which the beams are fixed on posts.
Figure 7B:
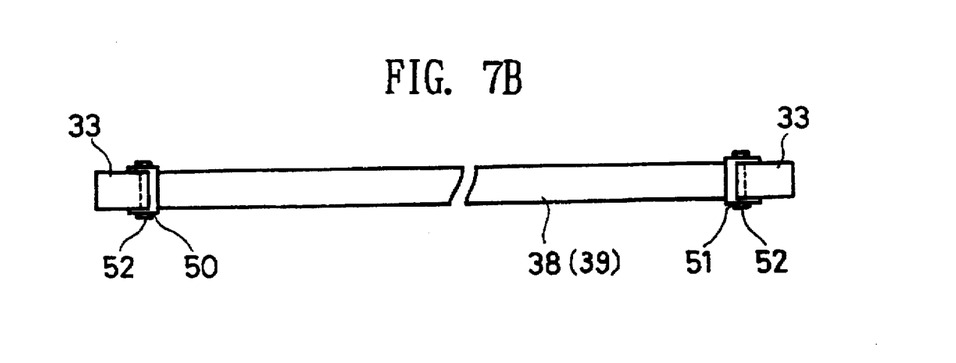

The upper placing stage 34 is mounted on the supporting bodies 33 as shown in FIGS. 7A and 7B.

Referring to FIGS. 7A and 7B, each of the beams 38 and 39 is provided with brackets 50 and 51 fixed on the ends of each of the beams 38 and 39. Each of the brackets 50 and 51 has a U-shape cross section and is engaged with a corresponding one of the supporting bodies 33 so as to hold a longitudinal beam 33a of the corresponding one of the supporting bodies 33. The longitudinal beam 33a is provided with holes 53 arranged along the edges thereof at intervals P2, and the brackets 50 and 51 are respectively provided with holes 50a and 51a. Bolts 52 are made to pass through the holes 50a (51a) of each of the brackets 50 and 51 and the holes 53 of the longitudinal beam 33a of the corresponding one of the supporting bodies 33, and are tightened, so that each of the beams 38 and 39 are fixed on the supporting bodies 33.

The distance between the lower placing stage 32 and the upper placing stage 34 corresponds to the height C of the information processing apparatus 90 to be installed on the lower placing stage 32. That is, the position at which each of the beams 38 and 39 is to be fixed on the supporting bodies 33 depends on the height C of the information processing apparatus 90. The position at which each of the beams 38 and 39 is fixed can be changed by changing the holes 53 through which the bolts 50 are made to pass.

The other vertical installation structure 31A is the same structure as the vertical installation structure 31B, as shown in FIGS. 2, 3 and 4.

The vertical installation structures 31 and 31A are installed on the floor 36 so as to be parallel to each other on opposite sides of an alley 54 in which the moving structure 60 is moved. The width G of the alley 54 is slightly greater than the width D of each of the vertical installation structures 31 and 31A.

The moving structure 60 is formed as follows. Referring to FIGS. 2, 3 and 4, the moving structure 60 has a lower stage 62 provided with wheels 61, props 63 standing on the lower stage 62, an upper stage 64 supported by the props 63 and a fence 64 mounted on the upper stage 64. The lower stage 62 is supported by wheels 61 so as to be level with the lower placing stage 32 of each of the vertical installation structures 31 and 31A, and the upper stage 64 is supported by the props 63 so as to be level with the upper placing stage 34 of each of the vertical installation structures 31 and 31A.

U-shaped members 66 which extend in a direction perpendicular to a direction in which the lower and upper stages 62 and 64 extend are fixed on the lower and upper stages 62 and 64. Guide rollers 67 and 68 are mounted on front and rear surfaces of the lower stage 62 and the upper stage 64. The guide rollers 67 and 68 mounted on the front surfaces of the lower stage 62 and the upper stage 64 roll on the rear surfaces of the lower and upper placing stages 32 and 34 of the vertical installation structure 31. The guide rollers 67 and 68 mounted on the rear surfaces of the lower stage 62 and the upper stage 64 roll on the front surfaces of the lower and upper placing stages 32 and 34 of the other vertical installation structure 31A. Thus, the moving structure 60 can be moved along the alley 54, being guided by the front and rear surfaces of the vertical installation structures 31 and 31A. The width I of the moving structure 60 is slightly greater than the width B of the information processing apparatus 90 but is much smaller than the width of a working area of a lifter 100 (shown in FIG. 8) which will be described later.

The air-conditioning equipment 80 is installed at a side of the vertical installation structures 31 and 31A as shown in FIGS. 2 and 3.

Ducts 81 and 82 extend from the air-conditioning equipment 80 to the vertical installation structures 31 and 31A respectively. The duct 81 has a first opening 81a connected to an end of the U-shaped structure 42 of the upper placing stage 34 and a second opening 81b connected to an end of a space 83 formed between the floor 36 and the lower placing stage 32. The other duct 82 also has openings connected to the other vertical installation structure 31A in the same manner as the first and second openings 81a and 81b of the duct 81.

Information processing apparatuses (e.g. large scale computers) are installed in the installation 30 having the above structures as follows.

The moving structure 60 is located at the entrance of the alley 54 so as to face the lifter 100. An information processing apparatus 90 is loaded on the lifter 100 and is lifted up to the level of the upper stage 64 of the moving structure 60. The information processing apparatus 90 is slid from the lifter 100 into the upper stage 64 of the moving structure 60 so as to be loaded thereon.

Figure 8:
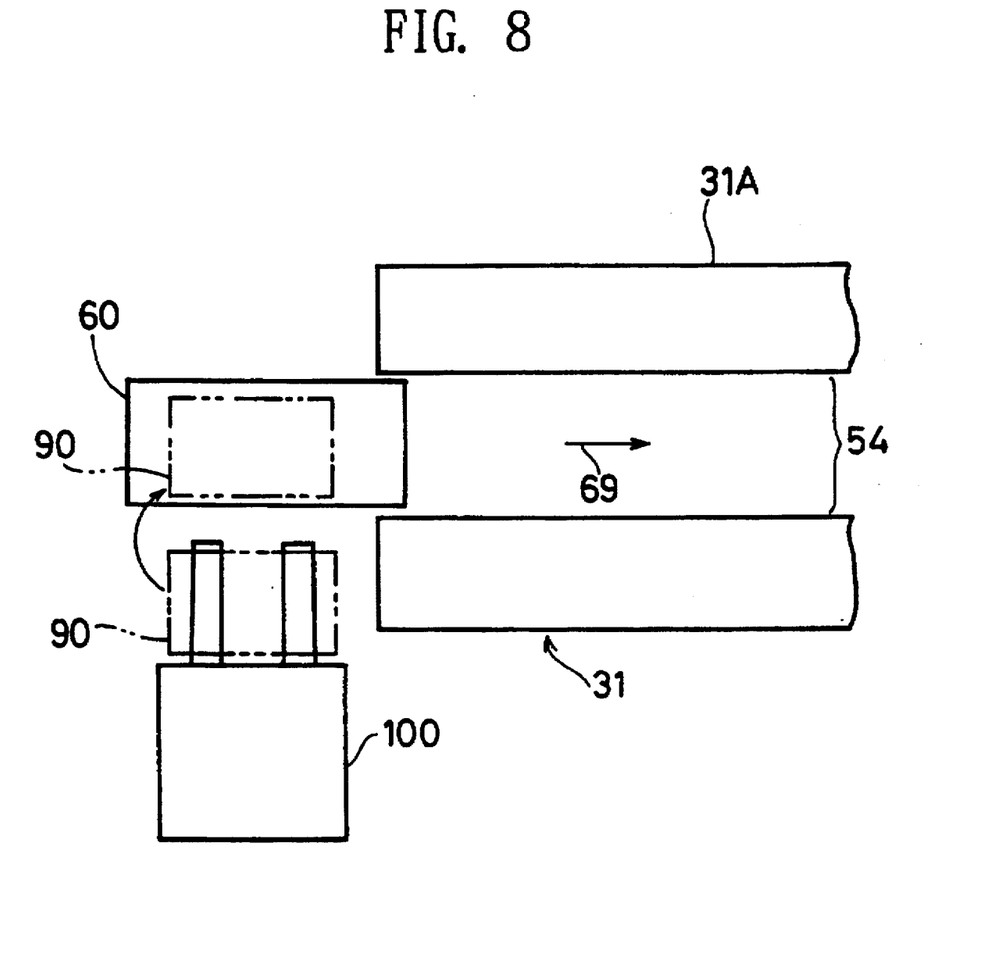
FIG. 8 is a diagram illustrating an initial step in a procedure for installing an information processing apparatus.

The moving structure 60 on which the information apparatus is loaded is moved along the alley in a direction 69 shown in FIG. 8 until it reaches a desired position. The moving structure 60 is guided by the front and rear surfaces of the vertical installation structures 31 and 31A on which surfaces the rollers 67 and 68 roll, so that the moving structure 60 moves without falling. Due to the moving structure 60, the heavy information processing apparatus 90 can be located at any position in the longitudinal direction along the alley 54.

Figure 9:
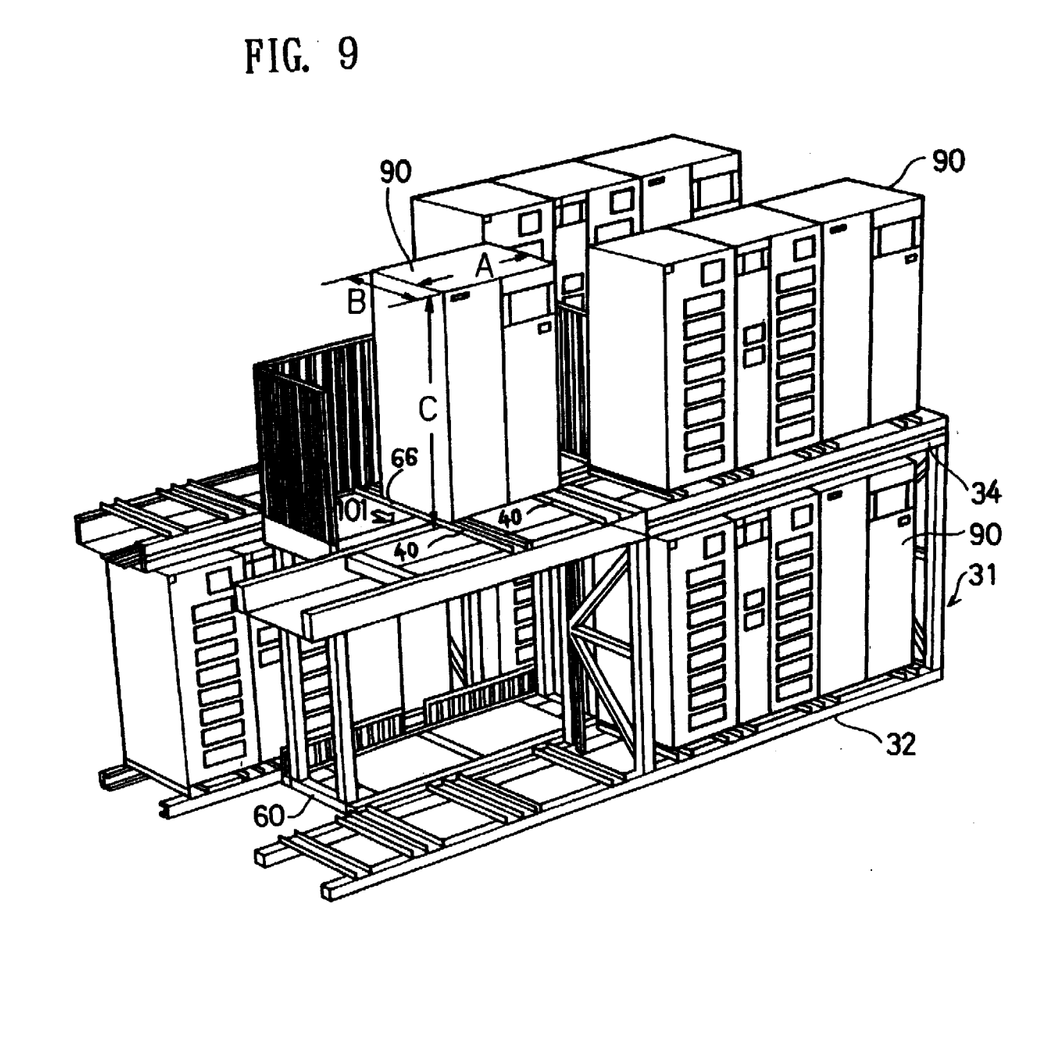
FIG. 9 is a perspective view illustrating an information processing apparatus being transported from a moving structure to a vertical installing structure.
Figure 10:
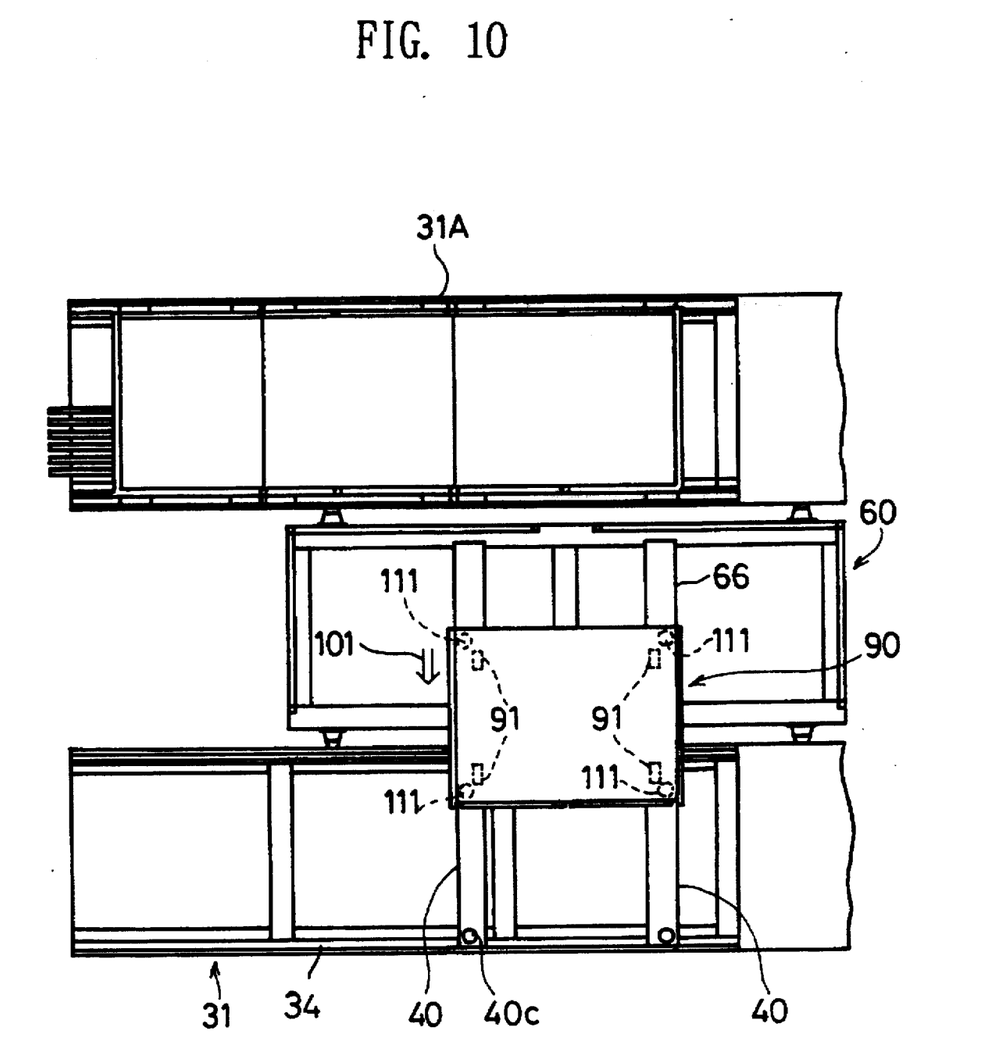
FIG. 10 is a plan view illustrating a state where the information apparatus is being transported from the moving structure to the vertical installing structure.
Figure 11:
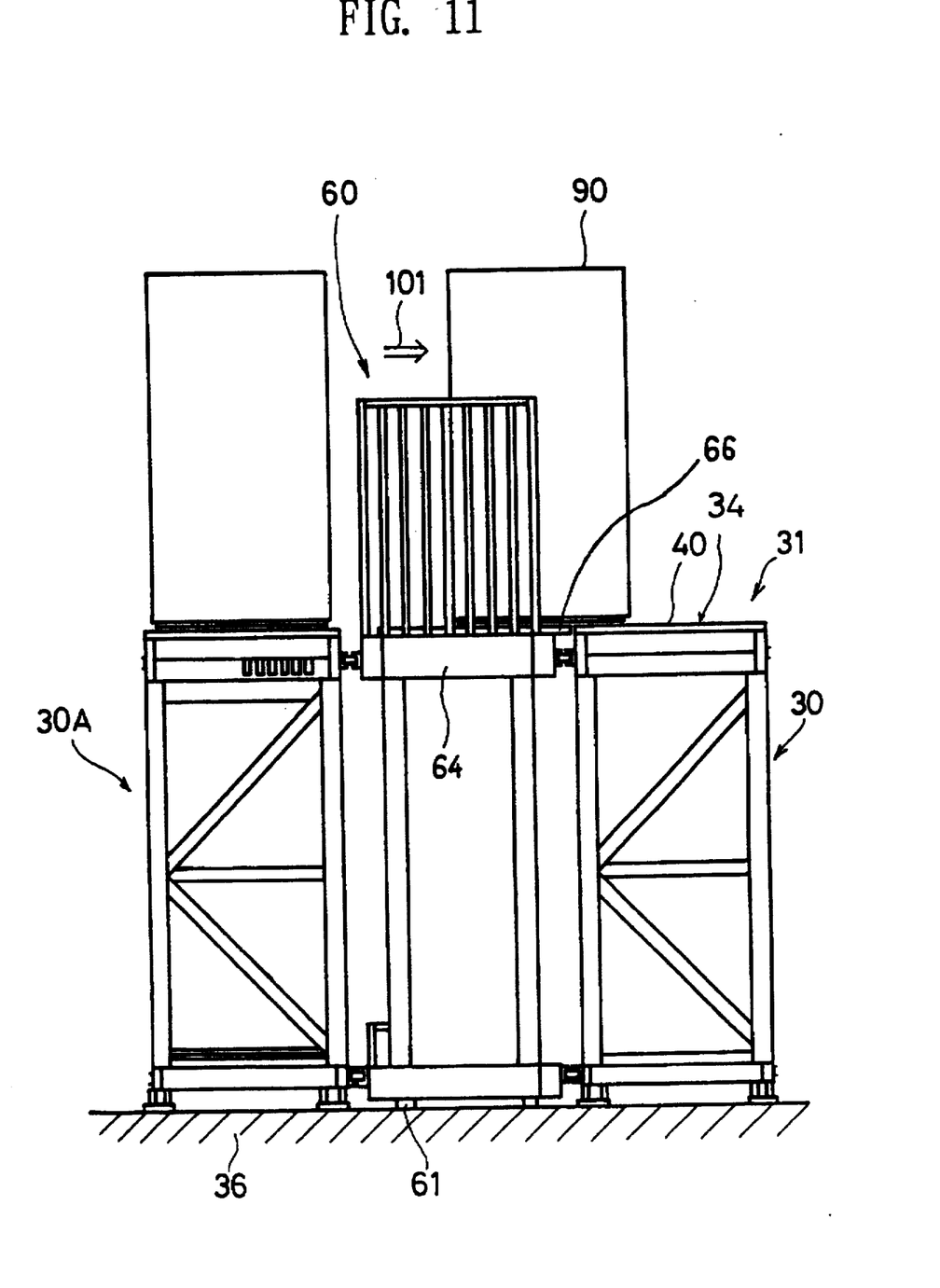
FIG. 11 is a side view illustrating the state where the information apparatus is being transported from the moving structure to the vertical installing structure.

The moving structure 60 is stopped at the desired position in a state where the U-shaped members 66 on the upper stage 64 of the moving structure 60 and the crossbeams 40 on the upper placing stage 34 of the vertical installation structure 31 are aligned as shown in FIGS. 9 and 10. The information processing apparatus 90 loaded on the upper stage 64 of the moving structure is pushed in a direction 110 shown in FIGS. 9 and 10. The outer surface of the bottom plate of the information processing apparatus 90 is provided with casters 91 as shown in FIG. 10. The casters 91 are engaged in the U-shaped members 66 on the moving structure 60, and, due to the pushing in the direction 110, the casters 91 roll on the U-shaped members 66 and continue to roll on the crossbeams 40. As a result, the information processing apparatus 90 is transferred from the upper stage 64 of the moving structure 60 to the upper placing stage 34 of the vertical installation structure 31, as shown in FIGS. 10 and 11. The information processing apparatus 90 is moved until the casters 91 hit the stopper bars 47 provided at the end of the crossbeams 40. The stopper bars 47 prevent the information processing apparatus 90 from falling down from the upper placing stage 34 of the vertical installation structure 31.

The information processing apparatus 90 transferred to the upper placing stage 34 of the vertical installation structure 31 is fixed on the upper placing stage 34 as follows.

Figure 12:
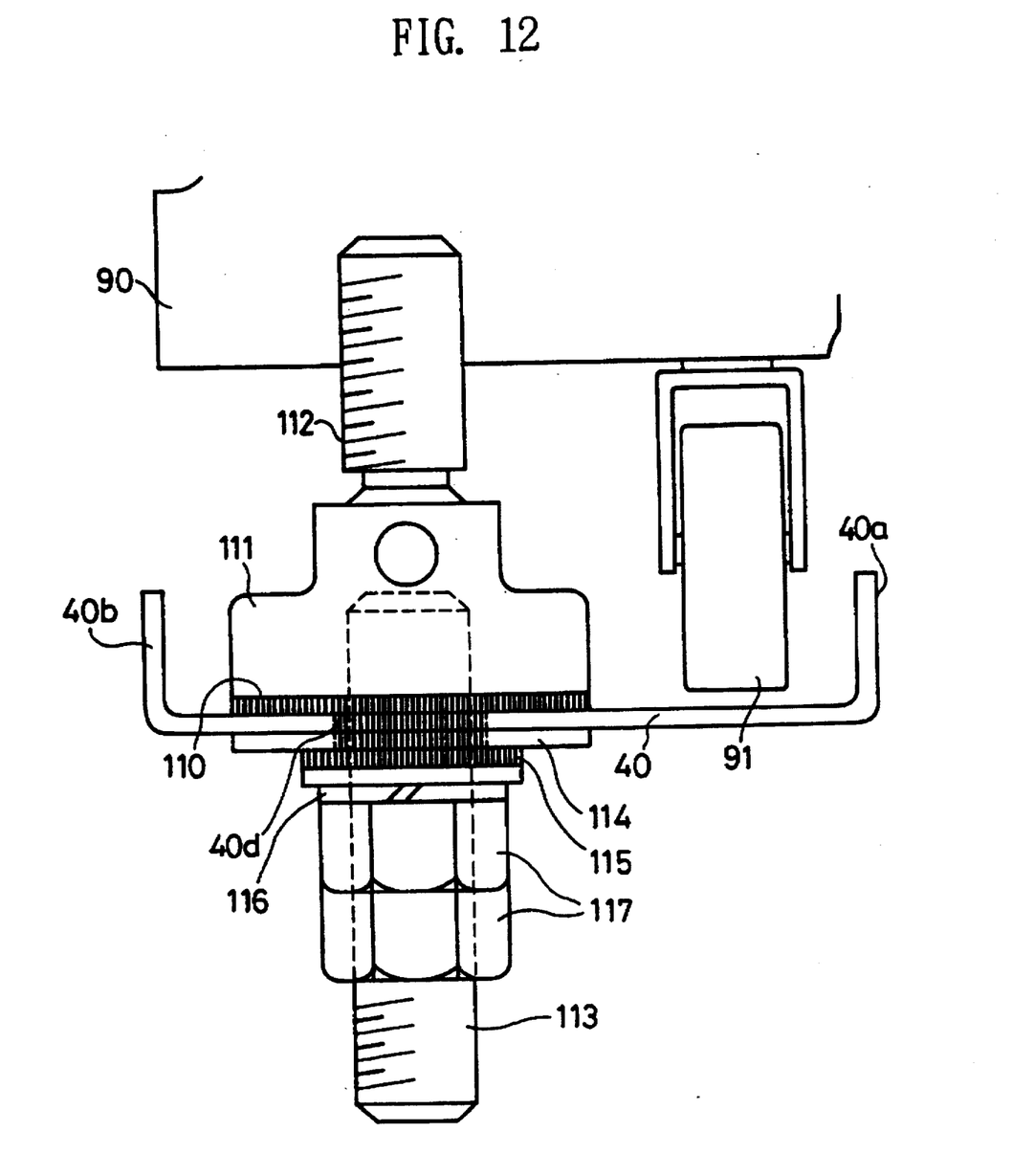
FIG. 12 is a diagram illustrating a structure of each support leg for an information processing apparatus.
Figure 13:
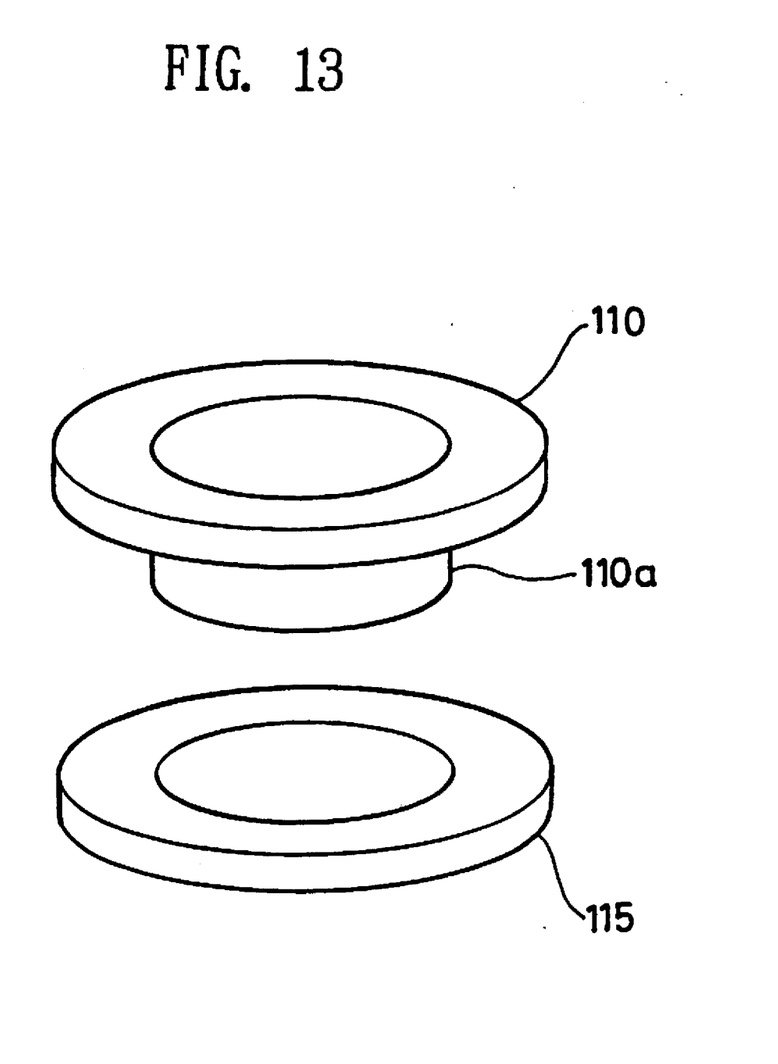
FIG 13 is a perspective view illustrating an insulating bush and an insulating ring shown in FIG. 12.

Each of the four corner portions of the bottom plate of the information processing apparatus 90 is fixed on the crossbeam 40 as shown in FIG. 12. Referring to FIG. 12, an insulating bush 110 having a sleeve 110a as shown in FIG. 13 is engaged in the mounting hole 40d formed on the crossbeam 40 so that the sleeve 110a passes through the mounting hole 40d. A support leg 111 and a bolt 112 engaged in each of the four corner portions of the bottom plate of the information processing apparatus 90 are integrated with each other. The support leg 111 is rotated so that the bolt 112 projects outward from the bottom plate of the information processing apparatus 90 until the caster 91 slightly floats by pressing of the support leg 111 against the crossbeam 40 via the insulating bush 110. As a result, the information processing apparatus 90 is supported by the support leg 111 at each of the four corner portions of the bottom plate. A passing bolt 113 passes through the sleeve 110a of the bush 110 and is engaged in the support leg 111. After this, a reinforcing plate 114 and an insulating bush 115 shown in FIG. 13 are engaged with the sleeve 110a of the bush 110 under the crossbeam 40, and two nuts 117 engaged in the passing bolt 113 are tightened so as to press via a washer 116 the insulating bush 115 and the reinforcing plate 114 against the crossbeam 40. As a result, the passing bolt 113 proceeds outward from the crossbeam 40, so that the support leg 111 supporting each of the four corner portions of the bottom plate of the information processing apparatus 90 is tightly fixed on the crossbeam 40. That is, the information processing apparatus 90 is tightly fixed on the crossbeams 40 on the upper placing stage 34 of the vertical installation structure 31. The information processing apparatus 90 is electrically insulated from the crossbeams 40, that is, the vertical installation structure 31, by the insulating bushes 110 and 115.

Installing of an information apparatus 90 to the lower placing stage 32 of the vertical installation structure 31 is performed using the lower stage 62 of the moving structure 60 in the same manner as the installing of the information apparatus 90 to the upper placing stage 34 described above.

Figure 14:
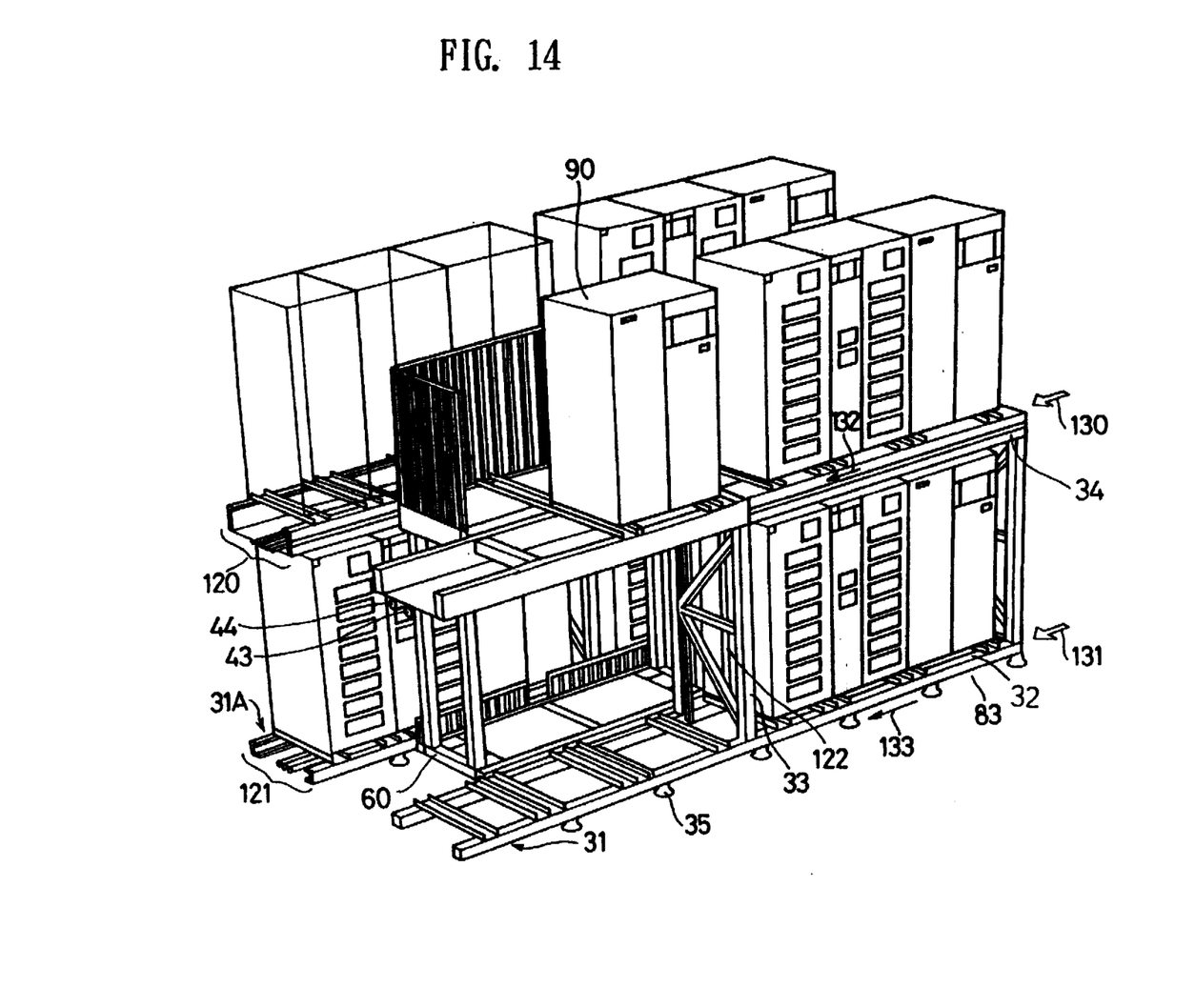
FIG. 14 is a perspective view illustrating the installation on which information processing apparatuses are installed.

A plurality of information processing apparatuses 90 are vertically installed in the vertical installation structures 31 and 31A as shown in FIG. 14. In each of the lower and upper stages 32 and 34, the information processing apparatuses 90 are horizontally arranged. Thus, the number of information processing apparatuses 90 installed in a unit area of the floor 36 is about twice as large as the number in the conventional case (see FIG. 1).

Information/power cables 120 are arranged in the vertical installation structures 31 and 31A as follows.

Information/power cables connected to the information processing apparatuses 90 which are installed on the upper placing stage 34 of each of the vertical installation structures 31 and 31A as shown in FIG. 14 are laid in the space 42a of the U-shaped structure 42. Information/power cables 121 connected to the information processing apparatuses 90 which are installed on the lower placing stage 32 of each of the vertical installing structures 31 and 31A are laid in the space 83 between the crossbeams 40 of the lower placing stage 32 and the floor 36. The wiring between the upper stage 34 and the lower stage is performed so that the cables 122 are laid along the supporting bodies 33.

Cooled air generated by the air-conditioning equipment 80 is guided by the ducts 81 (82) and is released from the first and second openings 81a and 81b connected, as shown in FIG. 3, to the upper placing stage 34 and the lower placing stage 32 of the vertical installation structures 31 (31A). The cooled air released from the first opening 81a is fed into the space 42a of the U-shaped structure 42 of the upper placing stage 34 in a direction 130 shown in FIG. 14. The U-shaped structure 42 functions as a duct, so that the cooled air flows through the space 42a of the U-shaped structure 42 in a direction 132. The cooled air ejected from the second opening 81b is fed into the space 83 under the lower placing stage 34 in a direction 131 shown in FIG. 14. The space 83 also functions as a duct, so that the cooled air flows through the space 83 in a direction 133.

Since the cooled air flows through in the space 42a of the U-shaped structure 42 of the upper placing stage 34 and flows through the space 43 under the lower placing stage 32, the cooled air is supplied to each of the information processing apparatuses from the bottom side thereof. As a result, the information processing apparatuses 90 are cooled by the cooled air.

The maintenance of the information processing apparatuses 90 installed in the lower placing stage 32 is performed in the same manner as that in a conventional case. On the other hand, the maintenance of the information processing apparatuses 90 installed in the upper placing stage 34 is performed using the moving structure 60. A worker rides on the moving structure 60, and the moving structure is moved to a position at which an information processing apparatus to be repaired is located. The worker riding on the moving structure 60 carries out operations to repair the information processing apparatus. Since the worker can carry out the operations on the moving structure 60, the maintenance working of the information processing apparatuses 90 installed on the upper placing stage 34 can be easily performed. In addition, the safety of the worker on the moving structure 60 is maintained by the fence 65 provided on the moving structure 60.

The vertical installation structures 31 and 31A are supported by the vibration-reducing support legs 35. Thus, the vertical installation structures 31 and 31A are exempted from the vibration such as earthquake. Since each of the information processing apparatuses 90 are tightly fixed on the lower and upper placing stages 32 and 34 by the mechanism as shown in FIG. 12, there is no danger of the information processing apparatuses 90 falling.

If the information processing apparatuses 90 catch fire, the high-sensitivity smoke detector detects smoke collected by the smoke sampling pipe 43 in an initial stage of the fire and a fire alarm is rapidly triggered. When the first alarm is triggered, the $CO_2$ gas sprinkler 44 is activated and the firer is extinguish by the $CO_2$-gas released from the $CO_2$-gas sprinkler 44.

In the above embodiment, the vertical installation structure has two placing stages vertically arranged. However, the number of placing stages vertically arranged, on which stages the information processing apparatuses are to be installed vertically arranged, may be equal to or greater than three.

The present invention is not limited to the aforementioned embodiments, and variations and modifications may be made without departing from the scope of the claimed invention.

What is claimed is:

1. A vertical installation structure providing vertical installation for information processing apparatuses, said vertical installation structure comprising:

a plurality of placing stages, each of the plurality of placing stages providing installation for at least one of the information processing apparatuses, each of the plurality of placing stages extending in a first direction, at least one of said plurality of placing stages comprising crossbeams extending in a second direction perpendicular to the first direction, each of the crossbeams comprising a bottom plate and standing walls coupled to and vertical to the bottom plate, each of the crossbeams having at least one hole in the respective bottom plate in which is inserted a sleeve through which a passing bolt passes, said passing bolt able to secure at least one of the information processing apparatuses to one of the crossbeams;

supporting members, coupled to the plurality of placing stages, supporting said plurality of placing stages so that the plurality of placing stages are vertically arranged; and fire detecting devices arranged along at least one of said plurality of placing stages.

2. A vertical installation structure providing vertical installation for information processing apparatuses, said vertical installation structure comprising:

a plurality of placing stages, each of the plurality of placing stages providing installation for at least one of the information processing apparatuses, each of the plurality of placing stages extending in a first direction, at least one of said plurality of placing stages comprising crossbeams extending in a second direction perpendicular to the first direction, each of the crossbeams comprising a bottom plate and standing walls coupled to and vertical to the bottom plate, each of the crossbeams at least one hole in the respective bottom plate in which is inserted a sleeve through which a passing bolt passes, said passing bolt able to secure at least one of the information processing apparatuses to one of the crossbeams; and supporting members, coupled to the plurality of placing stages, supporting said plurality of placing stages so that the plurality of placing stages are vertically arranged.

3. The vertical installation structure as claimed in claim 2, wherein at least said one of said plurality of placing stages comprises a U-shaped structure, having a space, on which said crossbeams are fixed crossing the space.

4. The vertical installation structure as claimed in claim 3, wherein said U-shaped structure comprises two beams parallel to each other and a bottom plate fixed on said two beams in a plane extending between said two beams.

5. The vertical installation structure as claimed in claim 2, wherein at least said one of said plurality of placing stages comprises a pair of beams parallel to each other, said crossbeams being mounted on said pair of beams.

6. The vertical installation structure as claimed in claim 2, wherein at least said one of said plurality of placing stages comprises a first adjusting mechanism adjusting a position of each of said crossbeams in the first direction.

7. The vertical installation structure as claimed in claim 2, further comprising at least one subset of the supporting members supporting one of the plurality of placing stages, said at least one subset of the supporting members comprising an adjusting mechanism for adjusting a position of the one of the plurality of placing stages in a vertical direction.

8. The vertical installation structure as claimed in claim 2, further comprising fire extinguishing devices able to extinguish a fire arranged along at least one of said plurality of placing stages.

* * * * *

UNITED STATES PATENT AND TRADEMARK OFFICE
CERTIFICATE OF CORRECTION

PATENT NO. : 5,664,688
DATED : Sept. 9, 1997
INVENTOR(S) : KITANAKA et al.

It is certified that error appears in the above-identified patent and that said Letters Patent is hereby corrected as shown below:

Col. 8, line 31 (Claim 2, line 13), after "beams" insert --having--.

Signed and Sealed this

Twenty-third Day of December, 1997

Attest:

BRUCE LEHMAN

Attesting Officer

Commissioner of Patents and Trademarks